United States Patent
Mokhnatyuk

(10) Patent No.: US 11,720,059 B2
(45) Date of Patent: Aug. 8, 2023

(54) METHOD, APPARATUS AND SYSTEM PROVIDING HOLOGRAPHIC LAYER AS MICRO-LENS AND COLOR FILTER ARRAY IN AN IMAGER

(71) Applicant: Micron Technology, Inc., Boise, ID (US)

(72) Inventor: Alexander Mokhnatyuk, South Pasadena, CA (US)

(73) Assignee: Micron Technology, Inc., Boise, ID (US)

(*) Notice: Subject to any disclaimer, the term of this patent is extended or adjusted under 35 U.S.C. 154(b) by 166 days.

(21) Appl. No.: 17/183,230

(22) Filed: Feb. 23, 2021

(65) Prior Publication Data

US 2021/0200149 A1    Jul. 1, 2021

Related U.S. Application Data

(60) Continuation of application No. 16/392,960, filed on Apr. 24, 2019, now Pat. No. 10,935,930, which is a continuation of application No. 15/606,454, filed on May 26, 2017, now Pat. No. 10,303,119, which is a continuation of application No. 13/914,784, filed on Jun. 11, 2013, now Pat. No. 9,678,474, which is a continuation of application No. 13/333,245, filed on Dec. 21, 2011, now Pat. No. 8,476,575, which is a division of application No. 11/656,442, filed on Jan. 23, 2007, now Pat. No. 8,101,903.

(51) Int. Cl.
*G03H 1/00* (2006.01)
*H01L 27/146* (2006.01)
*H04N 23/10* (2023.01)
*H04N 23/84* (2023.01)
*G03H 1/04* (2006.01)

(52) U.S. Cl.
CPC .............. *G03H 1/0005* (2013.01); *G03H 1/04* (2013.01); *H01L 27/14621* (2013.01); *H01L 27/14627* (2013.01); *H01L 27/14685* (2013.01); *H04N 23/10* (2023.01); *H04N 23/84* (2023.01)

(58) Field of Classification Search
CPC .. G03H 1/0005; G03H 1/04; H01L 27/14621; H01L 27/14627; H01L 27/14685; H04N 9/045; H04N 9/0451
See application file for complete search history.

(56) References Cited

U.S. PATENT DOCUMENTS

| | | |
|---|---|---|
| 5,764,389 A | 6/1998 | Grinberg et al. |
| 5,917,622 A | 6/1999 | Diffin et al. |
| 5,946,033 A | 8/1999 | Mooney et al. |
| 6,140,630 A | 10/2000 | Rhodes |
| 6,204,524 B1 | 3/2001 | Rhodes |

(Continued)

OTHER PUBLICATIONS

"What is a Hologram?" http://members.aol.com/jimb3d/hologram/hologram.html.
International Search Report dated May 8, 2008.

*Primary Examiner* — Tony Ko
(74) *Attorney, Agent, or Firm* — Perkins Coie LLP

(57) ABSTRACT

A method, apparatus, and system that provides a holographic layer as a micro-lens array and/or a color filter array in an imager. The method of writing the holographic layer results in overlapping areas in the hologram for corresponding adjacent pixels in the imager which increases collection of light at the pixels, thereby increasing quantum efficiency.

20 Claims, 8 Drawing Sheets

(56) References Cited

U.S. PATENT DOCUMENTS

| | | |
|---|---|---|
| 6,310,366 B1 | 10/2001 | Rhodes et al. |
| 6,326,652 B1 | 12/2001 | Rhodes |
| 6,333,205 B1 | 12/2001 | Rhodes |
| 6,376,868 B1 | 4/2002 | Rhodes |
| 6,738,171 B1 | 5/2004 | Campbell |
| 6,852,591 B2 | 2/2005 | Rhodes |
| 6,859,229 B1 | 2/2005 | Suda |
| 7,016,604 B2 | 3/2006 | Stavely et al. |
| 7,026,596 B2 | 4/2006 | Fossum |
| 7,224,388 B2 | 5/2007 | Takayanagi |
| 2003/0048361 A1 | 3/2003 | Safai et al. |
| 2004/0051806 A1 | 3/2004 | Cambou et al. |
| 2004/0183938 A1 | 9/2004 | Campbell et al. |
| 2008/0173793 A1 | 7/2008 | Mokhnatyuk et al. |
| 2009/0115011 A1* | 5/2009 | Ushiro .............. H01L 27/14621 257/E31.127 |

* cited by examiner

METHOD, APPARATUS AND SYSTEM PROVIDING HOLOGRAPHIC LAYER AS MICRO-LENS AND COLOR FILTER ARRAY IN AN IMAGER

CROSS REFERENCE TO RELATED APPLICATIONS

The present application is a continuation of U.S. patent application Ser. No. 16/392,960, filed Apr. 24, 2019, which is a continuation of U.S. patent application Ser. No. 15/606,454, filed May 26, 2017, now U.S. Pat. No. 10,303,119; which is a continuation of U.S. patent application Ser. No. 13/914,784, filed Jun. 11, 2013, now U.S. Pat. No. 9,678,474; which is a continuation of U.S. patent application Ser. No. 13/333,245, filed Dec. 21, 2011, now U.S. Pat. No. 8,476,575; which is a divisional of U.S. patent application Ser. No. 11/656,442, filed Jan. 23, 2007, now U.S. Pat. No. 8,101,903; each of which is incorporated herein by reference in its entirety.

FIELD OF THE INVENTION

Disclosed embodiments relate generally to a method, apparatus and system providing a micro-lens and/or color filter array in an imager.

BACKGROUND

Imaging devices, including charge coupled devices (CCD) and complementary metal oxide semiconductor (CMOS) sensors have commonly been used in photo-imaging applications. A CMOS imager circuit includes a focal plane array of pixels, each one of the pixels including a photosensor, for example, a photogate, photoconductor or a photodiode for accumulating photo-generated charge in the specified portion of the substrate. Each pixel has a charge storage region, formed on or in the substrate, which is connected to the gate of an output transistor that is part of a readout circuit. The charge storage region may be constructed as a floating diffusion region. In some imager circuits, each pixel may include at least one electronic device such as a transistor for transferring charge from the photosensor to the storage region and one device, also typically a transistor, for resetting the storage region to a predetermined charge level prior to charge transference.

In a CMOS imager, the active elements of a pixel perform the functions of: (1) photon to charge conversion; (2) accumulation of image charge; (3) resetting the storage region to a known state; (4) transfer of charge to the storage region; (5) selection of a pixel for readout; and (6) output and amplification of signals representing pixel reset level and pixel charge. Photo charge may be amplified when it moves from the initial charge accumulation region to the storage region. The charge at the storage region is typically converted to a pixel output voltage by a source follower output transistor.

Exemplary CMOS imaging circuits, processing steps thereof, and detailed descriptions of the functions of various CMOS elements of an imaging circuit are described, for example, in U.S. Pat. Nos. 6,140,630; 6,376,868; 6,310,366; 6,326,652; 6,204,524; 6,333,205; and 6,852,591, all of which are assigned to Micron Technology, Inc. The disclosures of each of the foregoing are hereby incorporated by reference in their entirety.

Semiconductor photosensors whether for a CMOS, CCD or other semiconductor imager can be fabricated on a common semiconductor substrate to form a pixel array. Each photosensor is responsive to radiation to produce an output that is a measurement of the amount of received radiation. An input optical device, such as a microlens array and/or an optical color filter array, are typically placed in the optical input path of the input radiation to control or manipulate the radiation in order for the radiation to be properly received at the pixels of the pixel array and within a specified color wavelength range. There is desire and need for simplified and efficient method, apparatus and system to focus and color separate input radiation in an imager.

DETAILED DESCRIPTION OF THE INVENTION

Figure 1:
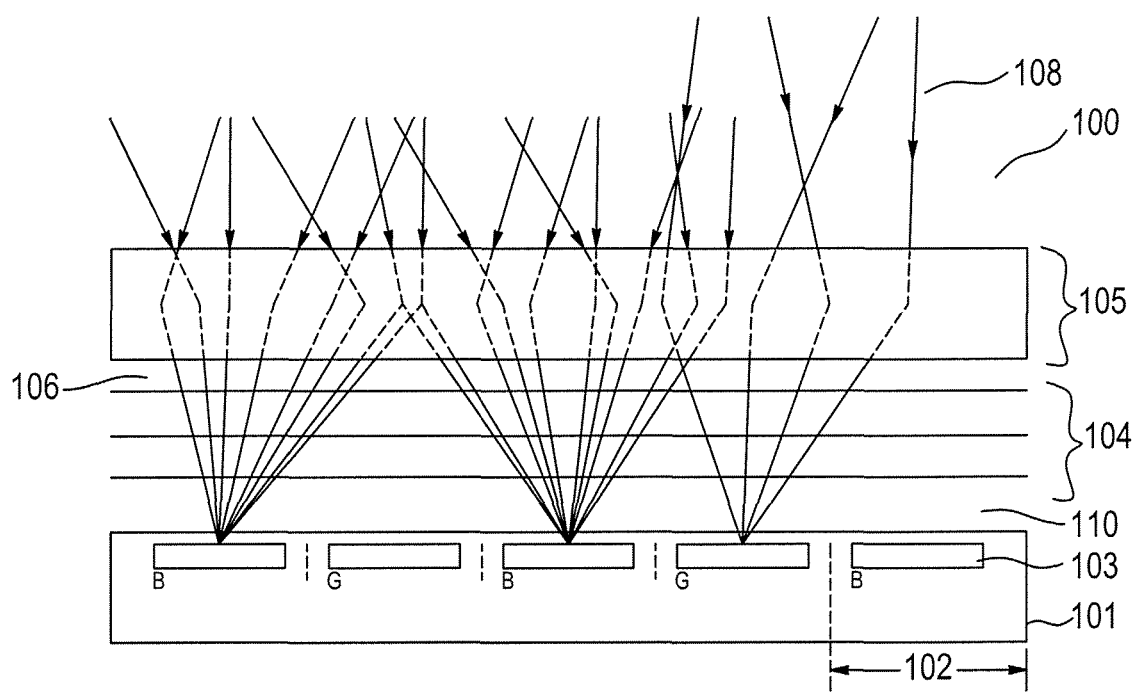
FIG. 1 is a schematic illustration of a first embodiment described herein.

Disclosed embodiments relate to a method, apparatus and system providing a holographic layer as a micro-lens and color filter array in an imager. The embodiments discussed herein enable an imaging device to focus and separate input radiation by using an optical holographic layer (OHL) for the pixel array of the imaging device instead of a separate and distinct color filter array and microlens array.

As used herein, the terms "semiconductor substrate" and "substrate" are to be understood to include any semiconductor-based structure. The semiconductor structure should be understood to include silicon, silicon-on-insulator (SOI), silicon-on-sapphire (SOS), silicon-germanium, doped and undoped semiconductors, epitaxial layers of silicon supported by a base semiconductor foundation, and other semiconductor structures. The semiconductor need not be silicon-based. The semiconductor could be other semiconductors including, for example, germanium or gallium arsenide. When reference is made to the semiconductor substrate in the following description, previous process steps may have been utilized to form regions or junctions in or over the base semiconductor or foundation.

The term "pixel," as used herein, refers to a photo-element unit cell containing a photosensor device and associated structures for converting photons to an electrical signal. For purposes of illustration, a representative three-color R, G, B pixel array is described herein; however, the invention is not limited to the use of an R, G, B color array. In addition, embodiments can also be used in a monochromatic array where just one color is sensed by the array. Accordingly, the following detailed description is not to be taken in a limiting sense.

It should also be understood that, taken alone, an imager pixel does not distinguish one incoming color of light from another and its output signal represents the intensity of light received and corresponds to quantum efficiency for the given color. For purposes of this disclosure, however, a pixel of a pixel array will be referred to by color (i.e., "red pixel," "blue pixel," etc.) when a color filter is used in connection with the pixel to pass a particular wavelength of light, corresponding to a particular color, onto the pixel. For example, when the term "red pixel" is used herein, it is referring to a pixel associated with a red color filter that filters wavelengths of light within a wavelength range centered at about 650 nm to the underlying pixel. Similar wavelength ranges exist for the "blue" and "green" pixels which are centered about a respective blue and green wavelength for each. It is also to be understood that when the term "blue pixel," "red pixel," or "green pixel" are used herein, they refer to the wavelengths of light coming to the pixel.

Moreover, while embodiments herein are described with reference to a semiconductor-based CMOS imager, it should be appreciated that the embodiments may be applied to any micro-electronic or micro-optical device that requires high quality microlenses and/or color filters for optimized performance. Other micro-optical devices that can employ the embodiments described herein include semiconductor CCD imagers, and display devices as well where a pixel emits light.

Semiconductor image sensor arrays may be designed to provide high-spatial-resolution sensing capability by implementing small sensing pixels. Each fundamental pixel includes a photosensitive element that absorbs input radiation to produce electric charges representative of the amount of received radiation. The radiation-induced charges are then read out in form of an electric current or voltage to produce a pixel output. Various types of photosensitive elements may be used, including but not limited to, photodiodes, photo conductors, and photogate sensors.

For CMOS imagers, each active pixel generally includes a photosensor and a pixel circuit with several associated transistors that provide in-pixel signal processing functions such as signal conversion, signal reset, and signal amplification and output. See e.g., U.S. Pat. No. 7,026,596 to Fossum.

Image sensor arrays may be designed to produce monochromatic images or color images. In a monochromatic image, each pixel may be used to produce an image pixel in the output image. Hence, the number of image pixels in the output image is dependent on the number of pixels in the array. A color image sensor array, however, typically uses three pixels for sensing different colors, e.g., red, blue and green with a demosaicing process to produce a multiple colored image pixel, e.g., a three-color pixel in the output image.

Disclosed embodiments provide an optical holographic layer (OHL) in an imager/pixel array that is used to process input radiation for detection by photosensors. The optical holographic layer is designed to operate as a microlens and/or as a color filter. The optical holographic layer may be used, in place of a separate microlens array and/or a color filter array, for focusing a spatial part of the input radiation on to a pixel's photosensitive element and/or to filter different spectral bands of received radiation to different pixels. This allows the pixel array to collect more light of predefined colors and thereby increases the quantum efficiency of the array by, for example, 2-10 times. Additionally, the use of the optical holographic layer decreases cross-talk between neighboring pixels.

An optical holographic layer is supposed to be optically refractive in nature when interacting with input radiation. Notably, an optical holographic layer may be fabricated in planar layer designs with surface features by using surface patterning techniques including those widely used in semiconductor fabrication. In contrast to the conventional optical fabrication of a microlens, complex fabrication of curved optical surfaces is eliminated in the optical holographic layer. In particular, as described below, an optical holographic layer can be integrated with other layers fabricated over a substrate containing a pixel array. Hence, the fabrication of the optical holographic layer and fabrication of the pixels of the pixel array may be integrated with one or more fabrication steps in a single fabrication process.

The optical holographic layer is formed of holograms, which may be simply optical grating patterns. In operation, the grating patterns break up a received input wave into multiple waves and combine the multiple waves into new waves with desired optical properties. Depending on specific requirements of the application, the grating patterns may be designed to carry out functions of many conventional optical devices such as optical diffractive gratings, optical lenses, and optical filters, and other functions that may be difficult or impractical to achieve with conventional optical devices. Such grating patterns may be fabricated in a wide range of materials, including metals such as aluminum, dielectric materials such as crystals (e.g., silicon) and non-crystal materials (e.g., glasses, silica, plastics).

One advantageous feature of an optical holographic layer is that the optical holographic layer may include different sets of holograms for simultaneously performing different optical functions. For example, in one embodiment, a hologram for a lens function and a hologram for a color filter function may be included in a single optical holographic layer to operate independently from each other without interference between the two. In comparison, conventional optical designs generally require a microlens array and a separate filter array stacked over each other and on top of the pixel array.

FIG. 1 shows a cross section of a portion of semiconductor imaging device 100 in accordance with a first embodiment. In FIG. 1, the imaging device 100 has an optical holographic layer 105 formed over a substrate 101 of a suitable semiconductor material (for example, silicon). The active area of the substrate 101 has pixels 102 arranged in a 1-dimensional or 2-dimensional array. In the FIG. 1 cross section, pixels are arranged in a Bayer pattern and the pixel row has an alternating arrangement of blue and green pixels. Each pixel 102 has a photoreceptor area 103, which absorbs input radiation, and other pixel circuit elements for producing a pixel output signal. Imaging device 100 also includes additional imager layers 104 such as a passivation layer, and interlevel dielectric (ILD) layers and associated metallization layers, which are fabricated to form pixel connection elements for connections with the pixels and from the pixel array to peripheral circuitry outside the array. The optical holographic layer 105 is formed over the upper surface of the additional layers 104. The hologram in the optical holographic layer 105 is designed to operate as a lens to focus received light to the photoreceptor area 103 of each pixel 102 in the substrate 101 and also to filter colors of the input radiation such that each pixel is associated with a particular color, for example, red, green, blue. An optical system, e.g., a main camera lens system, focuses the input radiation onto holographic layer 105.

The hologram in the optical holographic layer 105 focuses and color filters the multiple incident beams 108 from the lens and respectively directs the output beams 106 to the photoreceptor areas 103 of different pixels. The location of each photoreceptor area 103 may be in the center of or offset from the center of each pixel 102. In the latter case, the hologram may be designed to focus the beam 108 at the 90 degree chief ray angle (CRA) to maximize photo collection efficiency. (See FIG. 3).

Figure 2:
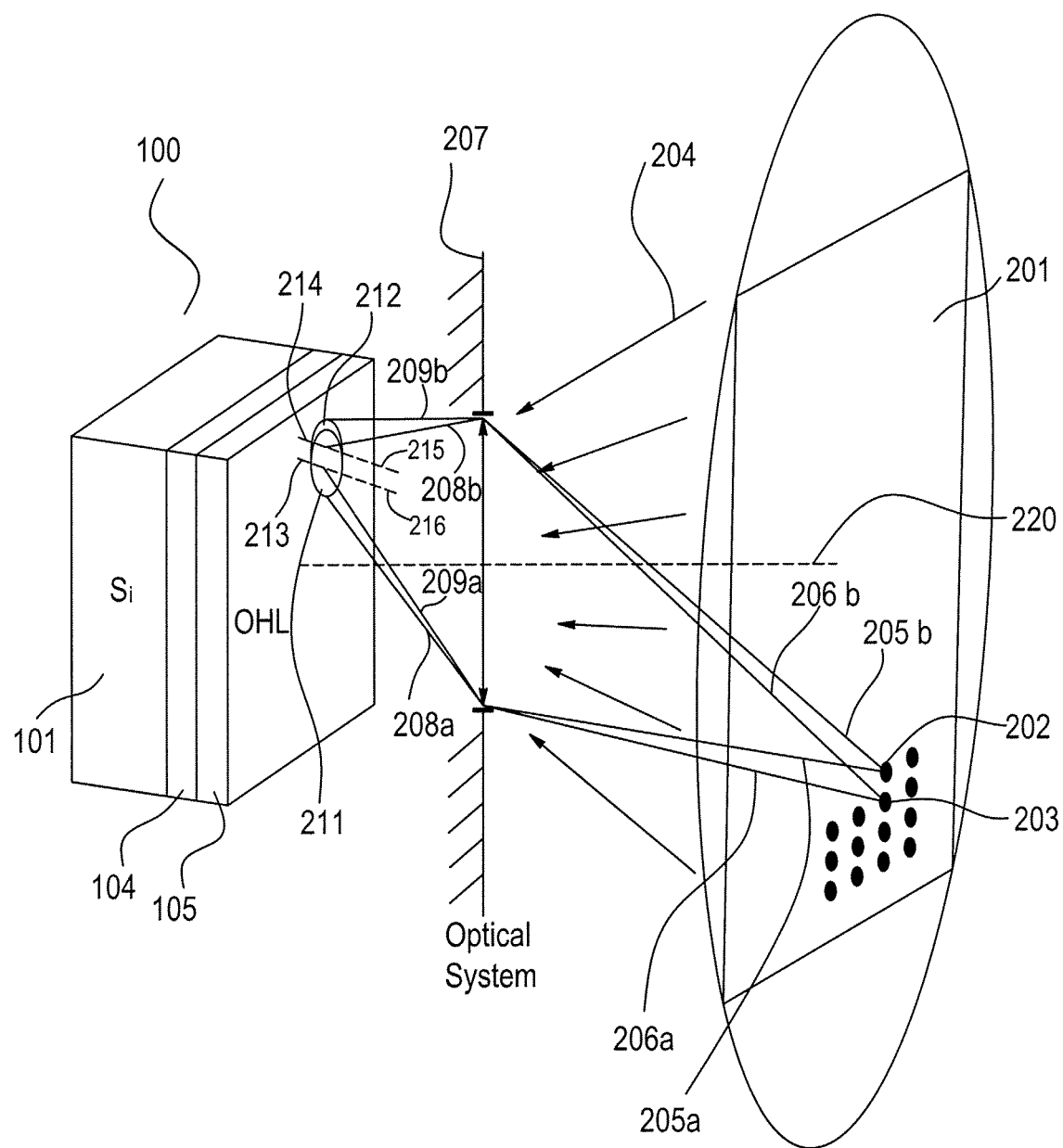
FIG. 2 is a schematic illustration of a second embodiment described herein.

FIG. 2 shows a method of writing or recording the optical holographic layer 105 in a semiconductor imaging device 100, in accordance with a second embodiment described herein. Holographic writing or recording uses a reference beam which is combined with light from an object beam, the reference beam and the object beam preferably emanating from coherent sources. Interference between the reference beam and the object beam, due to superposition of the light waves, produces a series of intensity fringes that may be recorded on a holographic material, for example, a photographic film. These fringes form a diffraction grating on the film called the hologram.

Diffraction gratings that make up a hologram may be phase gratings or amplitude gratings. In phase gratings, the refractive index of the holographic material is modulated by exposure. In amplitude gratings, the absorption constant of the holographic material is modulated by exposure.

Referring to FIG. 2, an object light source 201 has specially created color dot patterns in a 1-dimensional or 2-dimensional array corresponding to the pixels 102 in the semiconductor imaging device 100. Each color dot 202, 203 on the object light source 201 projects light to a corresponding area of layer 105 corresponding to respective color pixel 213, 214 through an optical system 207, preferably comprising an optical lens without aberrations. The semiconductor imaging device 100, the optical system 207 and the object light source 201 are aligned along an optical axis 220, with the optical system 207 placed between the imaging device 100 and the object light source 201. The object light source 201 may project light simultaneously or sequentially with a user-defined time interval.

The object light beams 205a-b, 206a-b emanating from the corresponding color dots 202, 203 interfere with a reference light 204 at the optical system 207. The reference light has red, green and blue components, or is light having wavelengths that are multiples of the red, green and blue components.

Light beams 208a-b, 209a-b pass through a respective elliptical area 211, 212 on the optical hologram layer 105 to the respective pixels 213, 214. The elliptical area 211, 212 is bigger than the area of the color pixel itself resulting in an increase of about 2-10 times in quantum efficiency for collection of light. The overlap of the elliptical areas 211, 212 corresponding to adjacent color pixels 213, 214 decreases cross-talk between color pixels because the interference of the incident light inside the hologram produces holographic deflected rays which converge to a center of a given pixel.

The optical system 207 is adjusted to focus each object light beam to the photoreceptor areas 103 (FIG. 1) of the corresponding color pixel on the semiconductor imaging device 100. For example, a red light emanating from a red color dot interferes with the same wavelength reference light when it passes through the optical holographic layer before being projected to a red pixel on the semiconductor imaging device. The interference between projected color dots light and the same color reference light produces a hologram in the optical holographic layer. In this way, the hologram is written in the optical holographic layer for each color separately, or for all colors simultaneously.

The location of each photoreceptor area 103 (FIG. 1) may be in the center of or offset from the center of each pixel 102 (FIG. 1). In the latter case, the hologram may be designed to focus the beams 208a-b at the off-center location to maximize the collection efficiency.

The hologram formed in the optical hologram layer 105 is designed to operate as a lens to focus received light to the photoreceptor area 103 (FIG. 1) of each pixel 102 (FIG. 1) in the substrate 101 and also to filter colors of the input radiation such that each pixel is associated with a particular color, for example, red, green, blue, during subsequent image capture operations. The hologram appears like a set of multiple grating patterns of elliptical size and each grating pattern is used to filter a specific color and to focus the filtered light to a designated color pixel.

The optical holographic layer after recording appears to be the same as it was before recording or writing. However, a pattern of refractive index modulation is written on the optical holographic layer due to exposure.

Figure 3:
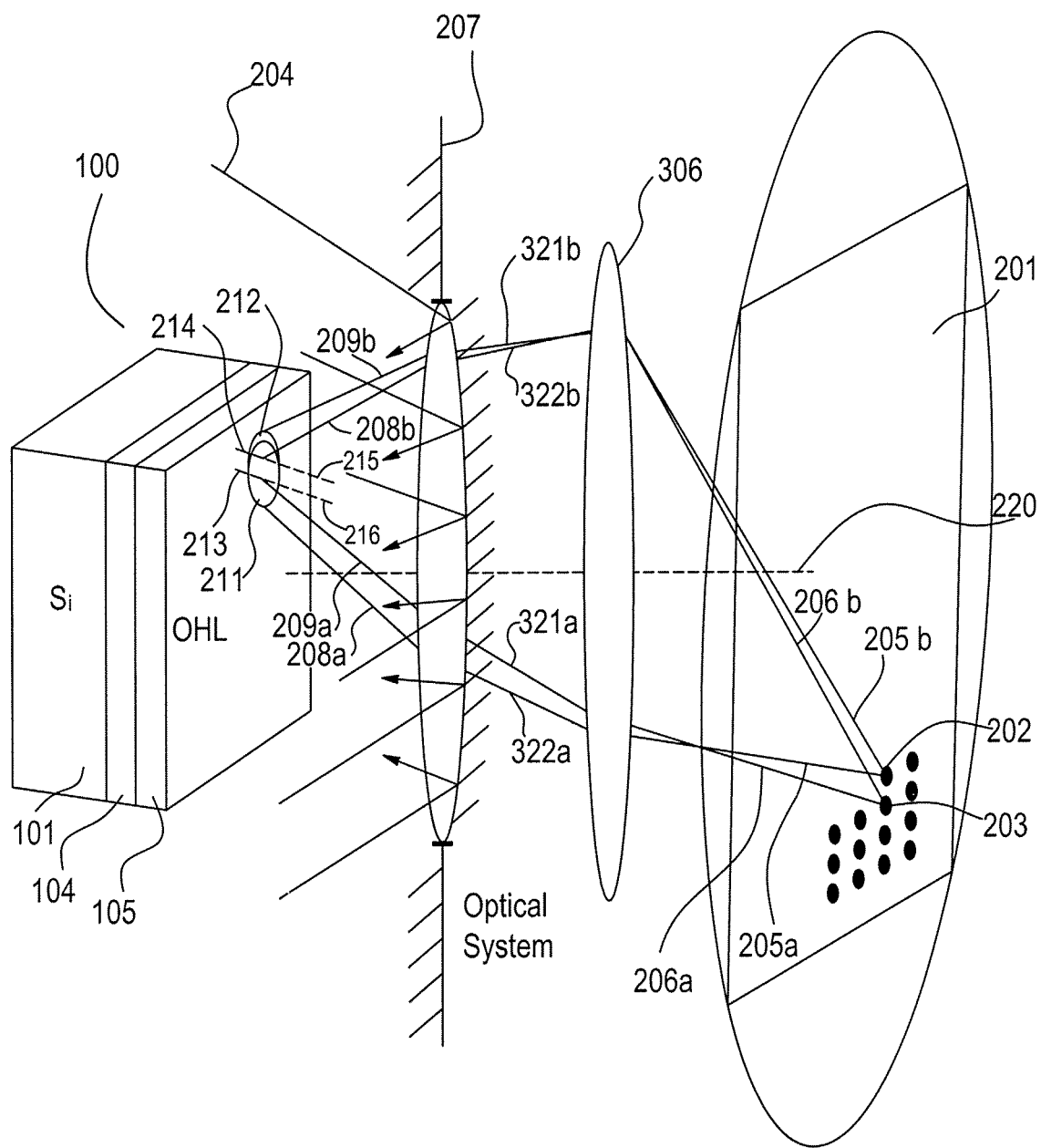
FIG. 3 is a schematic illustration of a third embodiment described herein.

FIG. 3 shows another embodiment of a method of recording an optical holographic layer 105 in a semiconductor imaging device 100.

An object light source 201 has specially created color dot patterns in a 1-dimensional or 2-dimensional array corresponding to the pixels 102 in the semiconductor imaging device 100. Each color dot 202, 203 on the object light source 201 projects light to a corresponding area of layer 105 corresponding to respective color pixel 213, 214 through an optical system 306 for the object light, preferably having an optical lens without aberrations, and an optical system for reference light 207. The semiconductor imaging device 100, the optical system 306 for the object light, the optical system for reference light 207, and the object light source 201 are aligned along an optical axis 220 with the optical system 306 for the object light placed between the object light source 201 and the optical system for reference light 207. The optical system for reference light 207 is placed between the semiconductor imaging device 100 and the optical system 306 for the object light. The object light source 201 may project light simultaneously or sequentially with a user-defined time interval.

The object light beams 205a-b, 206a-b emanating from the corresponding color dots 202, 203 are refracted by the optical system 306 for object light. The refracted beams 321a-b, 322a-b interfere with a reference light 204 at the optical system for reference light 207. The reference light has red, green and blue components, or is light having wavelengths that are multiples of the red, green and blue components. The optical system for reference light 207 may contain a concave semitransparent mirror for reflecting reference light and the optical system 306 for object light may contain lenses for projecting refracted beams 321a-b, 322a-b.

Light beams 208a-b, 209a-b pass through a corresponding elliptical area 211, 212 on the optical hologram layer 105 to the corresponding pixels 213, 214. The elliptical area 211, 212 is bigger than the area of the color pixel itself resulting in an increase of about 2-10 times in quantum efficiency for collection of light. The overlap of the elliptical areas 211, 212 corresponding to adjacent color pixels 213, 214 decreases cross-talk between color pixels. In another embodiment, the elliptical areas 211, 212 may be circular.

The optical system 306 for object light is adjusted to focus each object light beam to the photoreceptor areas 103 (FIG. 1) of the corresponding color pixel on the semiconductor imaging device 100. For example, a red light emanating from a red color dot is refracted by the optical system 306 for object light, interferes with the reference light 207 and passes through the optical holographic layer 105 before being projected to a red pixel on the semiconductor imaging device 100. For example, a red light emanating from a red color dot interferes with the same wavelength reference light 207 when they pass through the optical holographic layer 105 before being projected to a red pixel on the semiconductor imaging device 100. The interference between projected color dots light and the same color reference light produces a hologram in the optical holographic layer 105. In this way, a hologram is written in the optical holographic layer 105 for each color separately, or for all colors simultaneously.

The object light source 201, shown in FIG. 3, may use specially formed profiling of light emission for each color dot. This specially formed light emission may be spatially distributed and arranged such that the object light is incident normally to the substrate 101. For example, red and green object light chief rays 215, 216 are at a normal angle to the substrate 101 resulting in a 90 degree chief ray angle for the projected refracted beams 321a-b, 322a-b.

The location of each photoreceptor area 103 (FIG. 1) may be in the center of or offset from the center of each pixel 102 (FIG. 1). In the latter case, the hologram may be designed to focus the beams 209a-b at the off-center location to maximize the collection efficiency.

The hologram formed in the optical hologram layer 105 is designed to operate as a lens to focus received light to the photoreceptor area 103 (FIG. 1) of each pixel 102 (FIG. 1) in the substrate 105 and also to filter colors of the input radiation such that each pixel is associated with a particular color, for example, red, green, blue during subsequent image capture operations.

In another monochromatic embodiment, black and white holograms may be recorded or written onto holographic layer 105. In this method, reference light comprising an array of monochromatic light, for example, green color light, is projected onto the optical system, illustrated in FIGS. 2-3.

Figure 4:
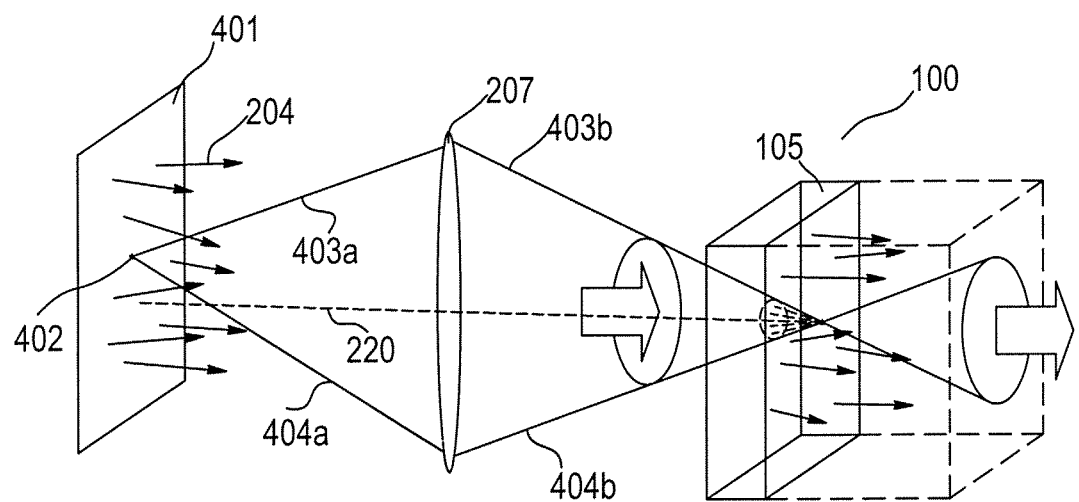
FIG. 4 is a schematic illustration of a fourth embodiment described herein.

FIG. 4 shows a method of recording an optical holographic layer 105 in a semiconductor imaging device 100, in accordance with another embodiment.

An object light source 402 comprises a plurality of point monochromatic light sources. The object light source 402 projects monochromatic light through an optical system 207, preferably including an optical lens without aberrations. The semiconductor imaging device 100, the optical system 207 and the object light source 402 are aligned along an optical axis 220, with the optical system 207 placed between the imaging device 100 and the object light source 401.

The object light beams 403a, 404a emanating from the object light source 402 interfere with a reference light 204 from a reference light source 401 at the optical system 207. Light beams 403b, 404b pass through a conical area 405 on the optical hologram layer 105.

After writing an optical holographic layer 105, using one of the above-mentioned methods, the optical holographic layer 105 has diffraction grating patterns due to modulation of refraction index of the layer. This written optical holographic layer modulation appears as a "frozen" optical holographic layer pattern.

Figure 5:
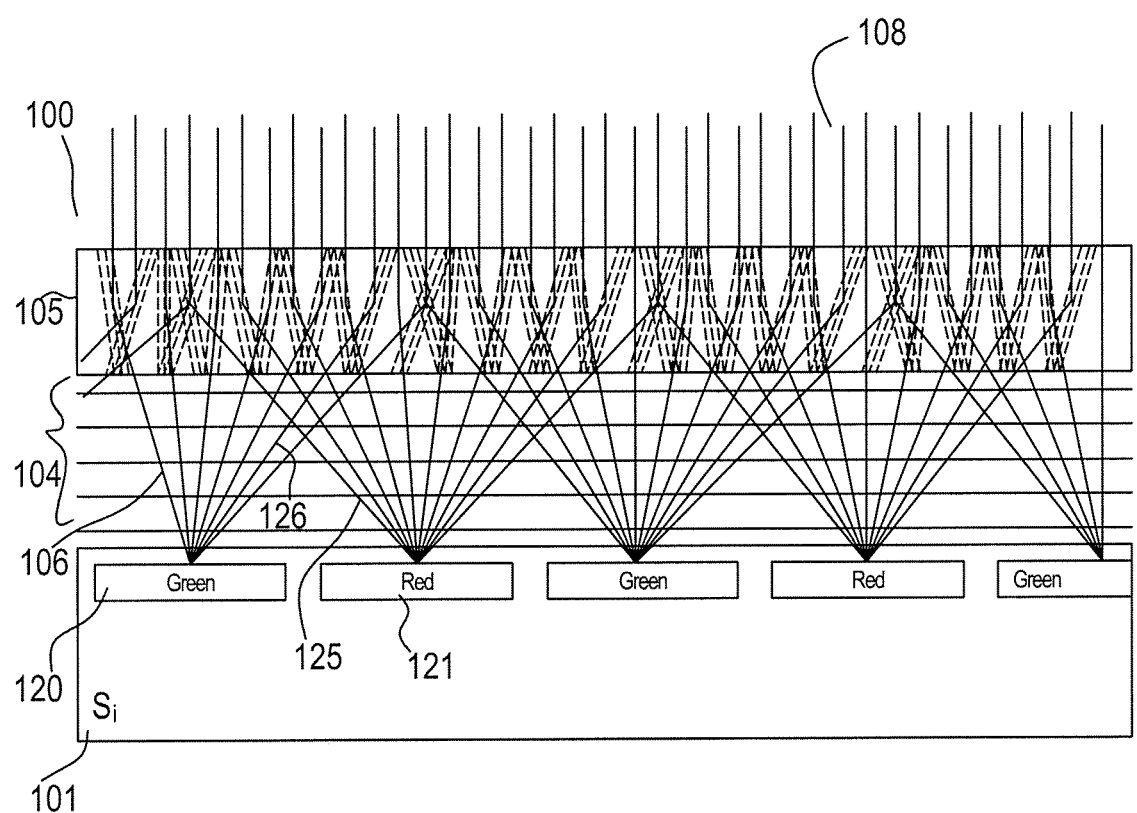
FIG. 5 is a schematic illustration of a written optical holographic layer used to increase quantum efficiency.

FIG. 5 illustrates an optical holographic layer 105, subsequent to writing using one of the above-mentioned methods, used to focus and color filter incident beams 108 from a lens and increasing quantum efficiency for collection of light. In a conventional imaging device using a microlens and a color filter array, a red pixel adjacent to a green pixel cannot collect red light incident on a portion of the color filter array corresponding to the green pixel. In contrast, the overlap of elliptical areas on the optical holographic layer 105 corresponding to adjacent color pixels 120, 121 results in the red pixel 121 collecting red light 125 and the green pixel 120 collecting the green light 126 and thereby, increasing the collection of light.

Figure 6:
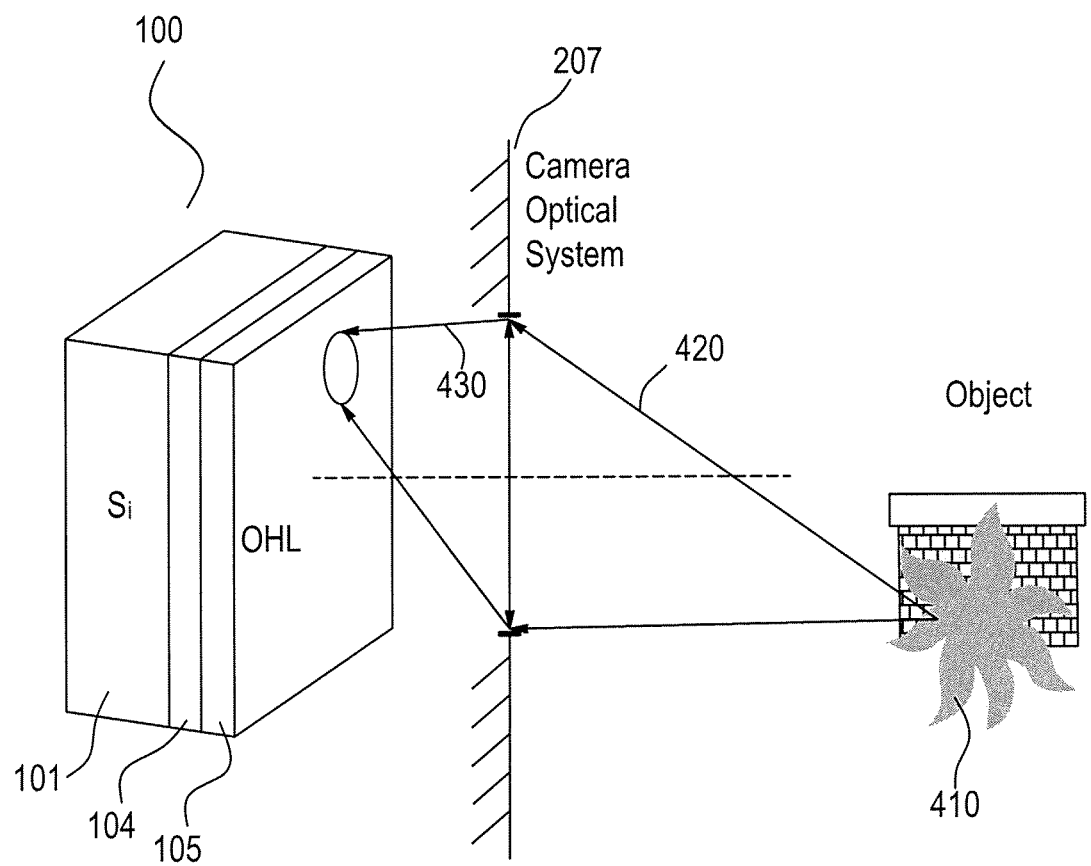
FIG. 6 is a schematic illustration of a fifth embodiment described herein.

FIG. 6 shows a method of capturing an image using a semiconductor imaging device 100 having a recorded optical holographic layer 105. Light 420 coming from an object 410 acts as a reference light for the recorded optical holographic layer 105. After passing through an optical system 207, for example, a lens of a camera, a light beam 430 passes through the optical holographic layer 105. The optical holographic layer 105 produces numerous color-filtered beams focused and directed to respective photosensors of pixels, as determined during the writing of the optical holographic layer 105.

When light passes through the optical holographic layer 105, the hologram filters the light into different colors and focuses the filtered light to the designated color pixels, for example, red color light to red color pixel, green color light to green color pixels and blue color light to blue color pixels of a Bayer pixel array. Color light is not absorbed as is the case with color filter array (CFA) with a conventional pixel array. Therefore, all light reaches appropriate color pixels with little distortion. This increases the quantum efficiency for a given imaging device by approximately 2-10 times.

Figure 7:
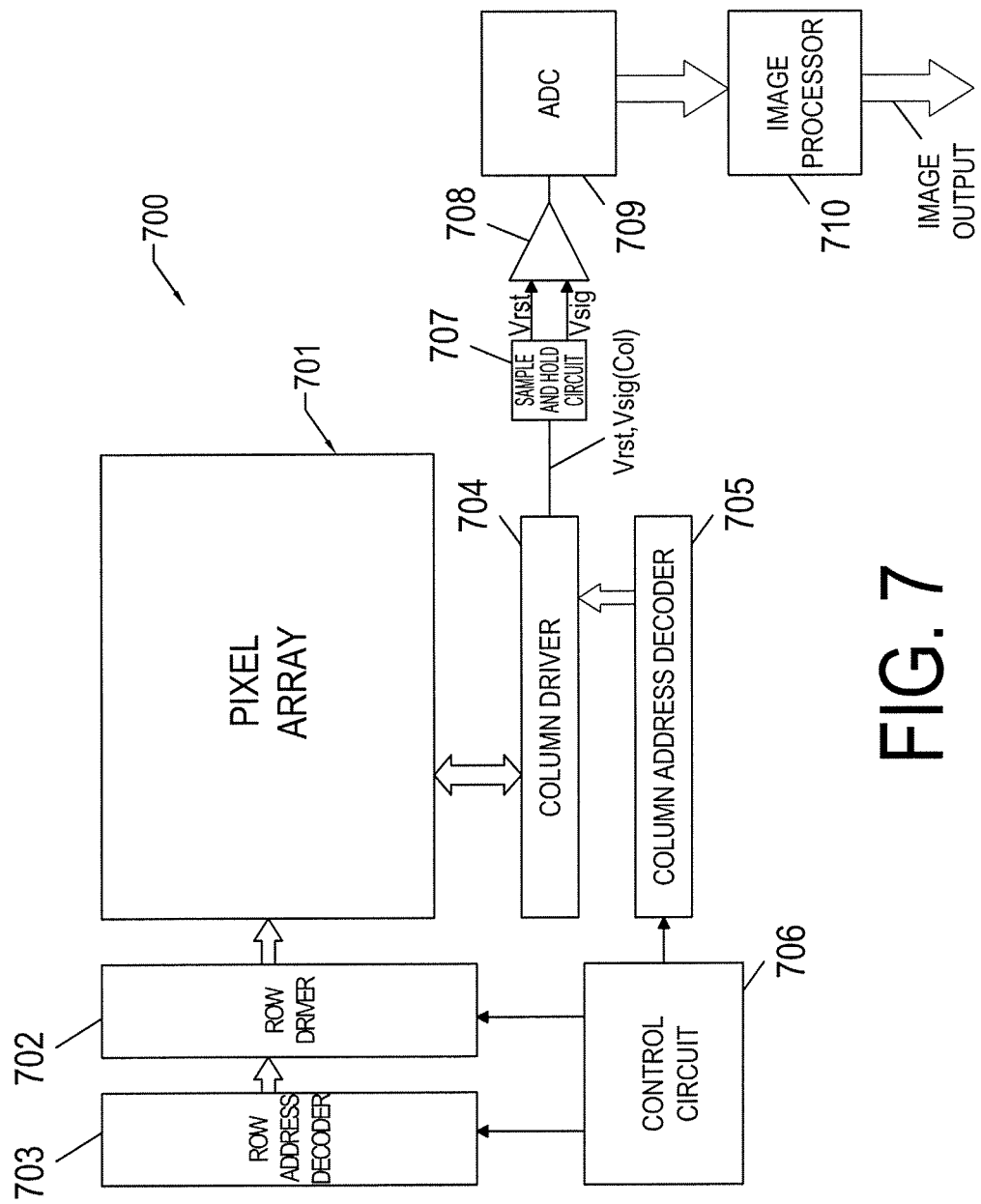
FIG. 7 is a block diagram illustrating a CMOS imaging device containing embodiments described herein.

Pixel array employing a recorded optical holographic layer may be used in an imaging device of the type depicted in FIG. 7. FIG. 7 illustrates a CMOS imaging device, although, as noted earlier, embodiments of the invention may be used with other types of imaging devices employing other pixel array structures, such as CCD, for example.

FIG. 7 illustrates a block diagram of a CMOS imager device 700 having a pixel array 701 with pixels 102. Pixel array 701 comprises a plurality of pixels 102 arranged in a predetermined number of columns and rows. The pixels 102 of each row in array 701 are all turned on at the same time by a row select line, and the pixels of each column are selectively output by respective column select lines. A plurality of row and column lines are provided for the entire array 701. The row lines are selectively activated in sequence by the row driver 702 in response to row address decoder 703 and the column select lines are selectively activated in sequence for each row activated by the column driver 704 in response to column address decoder 705. Thus, a row and column address is provided for each pixel. The CMOS imager 700 is operated by the control circuit 706, which controls address decoders 703, 705 for selecting the appropriate row and column lines for pixel readout, and row and column driver circuitry 702, 704, which apply driving voltage to the drive transistors of the selected row and column lines. The pixel output signals typically include a pixel reset signal, Vrst, taken off the floating diffusion node when it is reset and a pixel image signal, Vsig, which is taken off the floating diffusion node after charges generated by an image are transferred to it. The Vrst and Vsig signals are read by a sample and hold circuit 707 and are subtracted by a differential amplifier 708 that produces a signal Vrst-Vsig for each pixel, which represents the amount of light impinging on the pixels. This difference signal is digitized by an analog to digital converter 709. The digitized pixel signals are then fed to an image processor 710 to form a digital image. The digitizing and image processing can be performed on or off the chip containing the pixel array 701.

Figure 8:
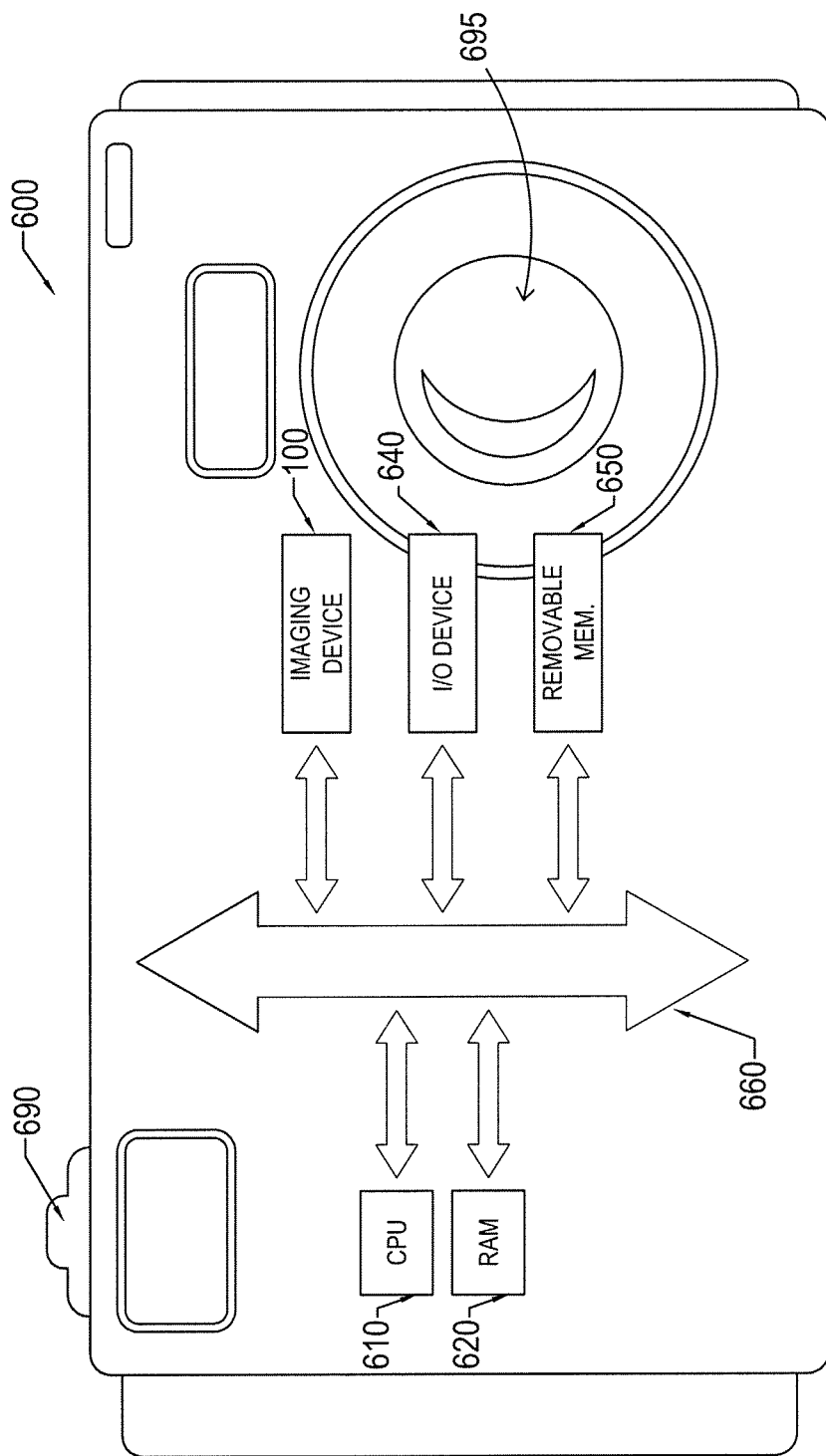
FIG. 8 is a block diagram illustrating a camera containing embodiments described herein.

FIG. 8 shows an image processor system 600, for example, a still or video digital camera system, which includes an imaging device 100, having a holographic layer 105 used as a lens and color separator. The imaging device 100 may receive control or other data from system 600 and may provide image data to the system. System 600 includes a processor having a central processing unit (CPU) 610 that communicates with various devices over a bus 660. For a camera, CPU 610 controls various camera functions. Some of the devices connected to the bus 660 provide communication into and out of the system 600; one or more input/output (I/O) devices 640 and imaging device 100 are such communication devices. Other devices connected to the bus 660 provide memory, illustratively including a random access memory (RAM) 620, and one or more peripheral memory devices such as a removable memory drive 650. A lens 695 is used to allow an image to be focused onto the imaging device 100 when e.g., a shutter release button 690 is depressed. The imaging device 100 may be coupled to the CPU for image processing or other image handling operations. Non-limiting examples of processor systems, other than a camera system, which may employ the imaging device 100, include, without limitation, computer systems, camera systems, scanners, machine vision systems, vehicle navigation systems, video telephones, surveillance systems, auto focus systems, star tracker systems, motion detection systems, image stabilization systems, and others.

While various embodiments of the invention have been described above, it should be understood that they have been presented by way of example, and not limitation. It will be apparent to persons skilled in the relevant art that various changes in form and detail can be made.

I claim:

1. An optical layer for use with a pixel array, the optical layer comprising:
   a hologram including a plurality of elliptical areas, wherein:
   each elliptical area of the plurality of elliptical areas corresponds to a respective pixel of the pixel array,
   elliptical areas of the plurality of elliptical areas that correspond to adjacent pixels in the pixel array at least partially overlap, and
   the hologram is configured (a) to filter colors of light incident on the optical layer and/or (b) to focus the light onto pixels of the pixel array.

2. The optical layer of claim 1, wherein an elliptical area of the plurality of elliptical areas has a larger area than a photoreceptor area of its respective pixel.

3. The optical layer of claim 1, wherein an elliptical area of the plurality of elliptical areas is configured to focus a portion of the light onto a photoreceptor area of its respective pixel.

4. The optical layer of claim 1, wherein an elliptical area of the plurality of elliptical areas is configured to focus a portion of the light onto its respective pixel at a 90° chief ray angle.

5. The optical layer of claim 1, wherein at least some elliptical areas of the plurality of elliptical areas include diffraction gratings.

6. The optical layer of claim 1, wherein:
   a first elliptical area of the plurality of elliptical areas includes a first diffraction grating;
   a second elliptical area of the plurality of elliptical areas includes a second diffraction grating; and
   a grating pattern of the first diffraction grating is different from a grating pattern of the second diffraction grating.

7. The optical layer of claim 1, wherein the optical layer is a planar layer.

8. The optical layer of claim 1, wherein:
   the hologram is a first hologram configured to filter the colors of the light incident on the optical layer; and
   the optical layer further includes a second hologram different from the first hologram and configured to focus the light onto the pixels of the pixel array.

9. The optical layer of claim 1, wherein the hologram is configured to both filter the colors of the light incident on the semiconductor structure and focus the light.

10. A semiconductor structure, comprising:
    a substrate; and
    an optical layer formed over the substrate, the optical layer including a hologram having a plurality of elliptical areas,
    wherein:
    each elliptical area of the plurality of elliptical areas corresponds to a respective pixel of a pixel array,
    elliptical areas of the plurality of elliptical areas that correspond to adjacent pixels in the pixel array at least partially overlap, and
    the hologram is configured (a) to filter colors of light incident on the semiconductor structure and/or (b) to focus the light.

11. The semiconductor structure of claim 10, wherein at least some elliptical areas of the plurality of elliptical areas include diffraction gratings.

12. The semiconductor structure of claim 10, wherein:
    a first elliptical area of the plurality of elliptical areas includes a first diffraction grating;
    a second elliptical area of the plurality of elliptical areas includes a second diffraction grating; and
    a grating pattern of the first diffraction grating is different from a grating pattern of the second diffraction grating.

13. The semiconductor structure of claim 10, wherein an elliptical area of the plurality of elliptical areas has a larger area than a photoreceptor area of its respective pixel.

14. The semiconductor structure of claim 10, wherein the optical layer is a planar layer.

15. The semiconductor structure of claim 10, wherein the pixel array is formed in the substrate.

16. The semiconductor structure of claim 10, wherein:
    the hologram is a first hologram configured to filter the colors of the light incident on the semiconductor structure; and
    the optical layer further includes a second hologram different from the first hologram and configured to focus the light.

17. The semiconductor structure of claim 10, wherein the hologram is configured to both filter the colors of the light incident on the semiconductor structure and focus the light.

18. An optical layer for use with a pixel array, the optical layer comprising:
    a hologram including a plurality of elliptical areas, wherein:
    each elliptical area of the plurality of elliptical areas corresponds to a respective pixel of the pixel array,
    an elliptical area of the plurality of elliptical areas has a larger area than a photoreceptor area of its respective pixel, and
    the hologram is configured to filter colors of light incident on the optical layer.

19. The optical layer of claim 18, wherein the hologram is further configured to focus the light onto pixels of the pixel array.

20. The optical layer of claim 18, wherein:
a first elliptical area of the plurality of elliptical areas includes a first diffraction grating;
a second elliptical area of the plurality of elliptical areas includes a second diffraction grating; and
a grating pattern of the first diffraction grating is different from a grating pattern of the second diffraction grating.

* * * * *